(12) United States Patent
Das et al.

(10) Patent No.: US 8,501,575 B2
(45) Date of Patent: Aug. 6, 2013

(54) METHOD OF FORMING MULTILAYER CAPACITORS IN A PRINTED CIRCUIT SUBSTRATE

(75) Inventors: Rabindra N. Das, Vestal, NY (US); Frank D. Egitto, Binghamton, NY (US); How T. Lin, Vestal, NY (US); John M. Lauffer, Waverly, NY (US); Voya R. Markovich, Endwell, NY (US)

(73) Assignee: Endicott Interconnect Technologies, Inc., Endicott, NY (US)

( * ) Notice: Subject to any disclaimer, the term of this patent is extended or adjusted under 35 U.S.C. 154(b) by 0 days.

(21) Appl. No.: 12/909,983

(22) Filed: Oct. 22, 2010

(65) Prior Publication Data

US 2012/0223047 A1    Sep. 6, 2012

Related U.S. Application Data

(63) Continuation-in-part of application No. 11/730,761, filed on Apr. 4, 2007, which is a continuation-in-part of application No. 11/352,279, filed on Feb. 13, 2006, now Pat. No. 7,449,381, which is a continuation-in-part of application No. 11/172,794, filed on Jul. 5, 2005, now Pat. No. 7,384,856, which is a continuation-in-part of application No. 11/031,085, filed on Jan. 10, 2005, now Pat. No. 7,541,265.

(51) Int. Cl.
*H01G 4/00* (2006.01)

(52) U.S. Cl.
USPC .......................................... 438/386; 205/291

(58) Field of Classification Search
None
See application file for complete search history.

(56) References Cited

U.S. PATENT DOCUMENTS

| | | | |
|---|---|---|---|
| 7,384,856 B2 | 6/2008 | Das et al. | |
| 7,429,510 B2 | 9/2008 | Das et al. | |
| 7,449,381 B2 | 11/2008 | Das et al. | |
| 2002/0085360 A1* | 7/2002 | Doi | 361/782 |
| 2005/0175385 A1* | 8/2005 | Cho et al. | 400/209 |
| 2005/0199681 A1* | 9/2005 | Lee et al. | 228/101 |
| 2006/0151863 A1 | 7/2006 | Das et al. | |
| 2007/0034519 A1* | 2/2007 | Chinda et al. | 205/125 |
| 2007/0177331 A1 | 8/2007 | Das et al. | |
| 2008/0078570 A1 | 4/2008 | Japp et al. | |

* cited by examiner

*Primary Examiner* — Michael J Feely
(74) *Attorney, Agent, or Firm* — Mark Levy; Hinman, Howard & Kattell, LLP

(57) ABSTRACT

Methods of forming embedded, multilayer capacitors in printed circuit boards wherein copper or other electrically conductive channels are formed on a dielectric substrate. The channels may be preformed using etching or deposition techniques. A photoimageable dielectric is an upper surface of the laminate. Exposing and etching the photoimageable dielectric exposes the space between the copper traces. These spaces are then filled with a capacitor material. Finally, copper is either laminated or deposited atop the structure. This upper copper layer is then etched to provide electrical interconnections to the capacitor elements. Traces may be formed to a height to meet a plane defining the upper surface of the dielectric substrate or thin traces may be formed on the remaining dielectric surface and a secondary copper plating process is utilized to raise the height of the traces.

4 Claims, 10 Drawing Sheets

METHOD OF FORMING MULTILAYER CAPACITORS IN A PRINTED CIRCUIT SUBSTRATE

RELATED APPLICATIONS

The present application is a Continuation-in-Part application of copending U.S. patent application Ser. No. 11/730,761 filed Apr. 4, 2007, which is a Continuation-in-Part of U.S. patent application Ser. No. 11/352,279, filed Feb. 13, 2006, now U.S. Pat. No. 7,449,381, which in turn is a Continuation-in-Part application of U.S. patent application Ser. No. 11/172,794, filed Jul. 5, 2005, now U.S. Pat. No. 7,384,856, which still further in turn is a Continuation-in-Part application of U.S. patent application Ser. No. 11/031,085, filed Jan. 10, 2005, now U.S. Pat. No. 7,541,265.

FIELD OF THE INVENTION

The invention pertains to capacitors embedded in circuit packaging structures and, more particularly, to methods of forming multilayer embedded capacitors in laminated circuit packaging structures.

RELATED PATENTS AND PATENT APPLICATIONS

In United States Patent Application Publication No. 2006/0151863, published Jul. 13, 2006 to Das et al., and entitled CAPACITOR MATERIAL FOR USE IN CIRCUITIZED SUBSTRATES, CIRCUITIZED SUBSTRATE UTILIZING SAME, METHOD OF MAKING SAID CIRCUITIZED SUBSTRATE, AND INFORMATION HANDLING SYSTEM UTILIZING SAID CIRCUITIZED SUBSTRATE and filed Jan. 10, 2005, there is defined a material for use as part of an internal capacitor within a circuitized substrate wherein the material includes a polymer (e.g., a cycloaliphatic epoxy or phenoxy based) resin and a quantity of nano-powders of ferroelectric ceramic material (e.g., barium titanate) having a particle size substantially in the range of from about 0.01 microns to about 0.90 microns and a surface area for selected ones of these particles within the range of from about 2.0 to about 20 square meters per gram. A circuitized substrate adapted for using such a material and capacitor therein and a method of making such a substrate are also described. An electrical assembly (substrate and at least one electrical component) and an information handling system (e.g., personal computer) are also described. In the examples discussed in Ser. No. 11/031,085, epoxy resin was mixed with hexahydro-4-methylphthalic anhydride, N, N dimethyl benzylamine and epoxy novolac resin. The mixed solution was stirred and barium titanate powder was added and formed into a screen printable paste. A layer of this material was screened through a 200-mesh screen onto the top surface of a copper first electrical conductor. This layer was then cured at approximately 150 degrees C. for about two hours, followed by an additional cure at approximately 190 degrees C. for about one hour. The second electrical conductor was then formed using a sputtering operation followed by a copper electroplating process and a photolithographic etch step.

In U.S. Pat. No. 7,384,856, issued on Jun. 10, 2008 to Das et al., and entitled METHOD OF MAKING AN INTERNAL CAPACITIVE SUBSTRATE FOR USE IN A CIRCUITIZED SUBSTRATE AND METHOD OF MAKING SAID CIRCUITIZED SUBSTRATE, there is defined a method of forming a capacitive substrate in which first and second conductors are formed opposite a dielectric, with one of these electrically coupled to a thru-hole connection. Each functions as an electrode for the resulting capacitor. The substrate is then adapted for being incorporated within a larger structure to form a circuitized substrate such as a printed circuit board or a chip carrier. Additional capacitors are also possible. In one of the examples (Example 5) cited in '856, epoxy novolac resin and a phenoxy resin are mixed together with barium titanate (BaTiO3) powder and propylene glycol monomethyl ether acetate and methyl ethyl ketone and ball milled for three days. A 2.5 micron thin film of this mixed composite was deposited on a copper substrate and dried at approximately 140 degrees C. for three minutes in an oven to remove residual organic solvents. This was followed by curing in an oven at 190 degrees C. for two hours. A second electrical conductor was then formed using a sputtering operation atop the cured film using a mask normally used for such sputtering operations.

In U.S. Pat. No. 7,429,510, issued Sep. 30, 2008 to Das et al., and entitled METHOD OF MAKING A CAPACITIVE SUBSTRATE USING PHOTOIMAGEABLE DIELECTRIC FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE, there is defined a method of forming a capacitive substrate in which at least one capacitive dielectric layer of material is screen or ink jet printed onto a conductor and the substrate is thereafter processed further, including the addition of thru-holes to couple selected elements within the substrate to form at least two capacitors as internal elements of the substrate. Photoimageable material is used to facilitate positioning of the capacitive dielectric being printed. The capacitive substrate may be incorporated within a larger circuitized substrate (e.g., to form an electrical assembly). A method of making an information handling system including such substrates is also provided.

In U.S. Pat. No. 7,449,381, issued Nov. 11, 2008 to Das et al., and entitled METHOD OF MAKING A CAPACITIVE SUBSTRATE FOR USE AS PART OF A LARGER CIRCUITIZED SUBSTRATE, METHOD OF MAKING SAID CIRCUITIZED SUBSTRATE AND METHOD OF MAKING AN INFORMATION HANDLING SYSTEM INCLUDING SAID CIRCUITIZED SUBSTRATE, there is described a method of forming a capacitive substrate in which at least one capacitive dielectric layer of material is screen or ink jet printed onto a conductor and the substrate is thereafter processed further, including forming thru-holes to couple selected elements within the substrate to form at least two capacitors as internal elements of the substrate. The capacitive substrate may be incorporated within a larger circuitized substrate (e.g., to form an electrical assembly). A method of making an information handling system including such substrates is also provided. As in Example 5 of '856, above, epoxy novolac resin and a phenoxy resin are mixed together with barium titanate (BaTiO$_3$) powder and propylene glycol monomethyl ether acetate and methyl ethyl ketone and ball milled for three days. A 2.5 micron thin film of this mixed composite is then deposited on a copper substrate and dried at approximately 140 degrees C. for three minutes in an oven to remove residual organic solvents. This is followed by curing in an oven at 190 degrees C. for two hours. A second electrical conductor was then formed using a sputtering operation atop the cured film using a mask normally used for such sputtering operations.

In United States Patent Application Publication No. 2008/0078570, published Apr. 3, 2008 to Japp et al., and entitled HALOGEN-FREE CIRCUITIZED SUBSTRATE WITH REDUCED THERMAL EXPANSION, METHOD OF MAKING SAME, MULTILAYERED SUBSTRATE STRUCTURE UTILIZING SAME, AND INFORMATION HANDLING SYSTEM UTILIZING SAME, filed Oct. 3, 2006, there is described a circuitized substrate including a composite layer comprising a first dielectric sub-layer comprising a halogen-free resin and fibers dispersed therein and a second dielectric sub-layer without fibers but also including a halogen-free resin with inorganic particulates therein. A method of making such a substrate is also provided, as is a multilayered assembly including one or more such circuitized substrates, possibly in combination with other substrates. An information handling system designed for having one or more such circuitized substrates is also provided.

In United States Patent Application Publication No. 2007/0177331, published Aug. 2, 2007 to Das et al., and entitled NON-FLAKING CAPACITOR MATERIAL HAVING AN INTERNAL CAPACITOR THEREIN INCLUDING SAID NON-FLAKING CAPACITOR MATERIAL AND METHOD OF MAKING A CAPACITOR MEMBER FOR USE IN A CAPACITIVE SUBSTRATE, filed Apr. 4, 2007, there is described a capacitor material including a thermosetting resin (e.g., epoxy resin), a high molecular mass flexibilizer (e.g., phenoxy resin), and a quantity of nano-particles of a ferroelectric ceramic material (e.g., barium titanate), the capacitor material not including continuous or semi-continuous fibers (e.g., fiberglass) as part thereof. The material is adapted for being positioned in layer form on a first conductor member and heated to a predetermined temperature whereupon the material will not possess any substantial flaking characteristics. A second conductor member may then be positioned on the material to form a capacitor member, which then may be incorporated within a substrate to form a capacitive substrate. Electrical components may be positioned on the substrate and capacitively coupled to the internal capacitor. The capacitor material as defined in this application may be used in the present invention.

All of the above pending applications are commonly assigned to the assignee of the present application and, along with the aforecited issued patents, are hereby incorporated by reference.

BACKGROUND OF THE INVENTION

Printed circuit boards (hereinafter also referred to as PCBs), chip carriers, and the like (all referred to herein as "circuitized substrates") are typically produced in laminate form in which several layered dielectric and conductive material members (laminates) are bonded together using conventional lamination processing involving relatively high temperatures and pressures. The conductive layers, typically of thin copper, are usually used in the formed substrate for providing electrical connections to and among various devices located on the surface of the substrate, examples of such devices being integrated circuits (semiconductor chips) and discrete passive devices, such as capacitors, resistors, inductors, and the like. Typically, these discrete passive devices occupy a high percentage of the surface area of the completed multi-layered substrate, which is obviously undesirable from a future design perspective due to the ever-present demand for miniaturization.

There have been various efforts to include multiple functions (e.g., resistors, capacitors and the like) within a single component adapted for being mounted on a substrate (e.g., PCB) in an attempt to increase the available upper substrate surface area (also often referred to as "real estate"). When passive devices are in such a configuration, these are often referred to collectively and individually as integral passive devices or the like, meaning that the functions are integrated into the singular component. Because of such external positioning, these components still utilize, albeit less than if in singular form, valuable board real estate. In response, there have been efforts to embed discrete passive components within the board. When so positioned, such components are also referred to as "embedded" passive components. A capacitor designed for disposition within (between selected layers of) a PCB substrate may thus be referred to as an embedded integral passive component, or, more simply, an embedded capacitor. Such a capacitor thus provides internal capacitance. The result of this internal positioning is that it is unnecessary to also position such devices externally on the PCB's outer surface(s), thus saving valuable PCB real estate.

For an established capacitor area, two approaches are known for increasing the planar capacitance (capacitance/area) of an internal capacitor. In one such approach, higher dielectric constant materials can be used, while in a second, the thickness of the dielectric can be reduced. These constraints are reflected in the following formula, known in the art, for capacitance per area:

$$C/A = (\text{Dielectric Constant of Laminate} \times \text{Dielectric Constant in Vacuum/Dielectric Thickness})$$

where: C is the capacitance and A is the capacitor's area. Additional formulae are provided herein with respect to defining capacitance values for the structures formed herein.

As mentioned above, there have been previous attempts to provide internal capacitance and other internal conductive structures, components or devices (one good example being internal semiconductor chips) within circuitized substrates such as PCBs, some of these including the use of nano-powders. The cited application Ser. No. 11/031,085 and U.S. Pat. No. 7,384,856 also define such approaches. Some of the patents and some pending applications cited above mention the use of various materials for providing desired capacitance levels. With respect to the following patents, some mention or suggest problems associated with the methods and resulting materials used to do so.

None of the methods of the prior art produce embedded capacitors having as high a capacitive volumetric efficiency as the method of the present invention. In other words, higher capacitance capacitors may be formed in smaller volumes within the laminated printed circuit board than has heretofore been possible.

None of the patents and published patent applications, taken singly, or in any combination are seen to teach or suggest the novel methods forming embedded, multilayer capacitors of the present invention.

SUMMARY OF THE INVENTION

In accordance with the present invention there are provided methods of forming embedded, multilayer capacitors in printed circuit boards. In each embodiment of the invention, copper or other electrically conductive channels are formed on a dielectric substrate. The copper channels may be pre-formed using etching or deposition techniques. For example, in at least one embodiment of the invention, an FR4 or similar copper clad laminate is etched with a desired pattern comprising substantially parallel traces. A photoimageable dielectric is vacuum bonded to the copper-bearing surface of the laminate. Exposing and etching the photoimageable dielectric exposes the space between the copper traces. These spaces are then filled with a capacitor material. Finally, copper is either laminated or deposited atop the structure. This upper copper layer is then etched to provide the necessary electrical interconnections to the capacitor elements formed by the copper traces and the capacitor material.

In other embodiments, the traces are heightened using a copper plating technique, typically an electroless plating process.

In still other embodiments, a relatively thick dielectric substrate has an opening formed in a major surface thereof, the opening being sized and configured to leave a thin dielectric layer at the bottom thereof. Copper traces are then deposited on the remaining thin dielectric layer. Traces may be formed to a height to meet a plane defining the upper surface of the dielectric substrate.

In other embodiments, thin traces are formed on the remaining dielectric surface and a secondary copper plating process is utilized to raise the height of the traces. Capacitor material is placed between the traces.

It is, therefore, an object of the invention to provide a method of forming a multilayer capacitor in a printed circuit board.

It is another object of the invention to provide a method of forming a multilayer capacitor in a printed circuit board wherein a plurality of substantially copper traces are formed on a dielectric substrate.

It is an additional object of the invention to provide a method of forming a multilayer capacitor in a printed circuit board wherein capacitor material is placed between substantially parallel copper traces.

It is a further object of the invention to provide a method of forming a multilayer capacitor in a printed circuit board wherein substantially parallel copper traces are electrically interconnect to form sections of a multilayer capacitor.

It is a still further object of the invention to provide a method of forming a multilayer capacitor in a printed circuit board that reduces manufacturing time, increases the capacitance of the formed capacitors, and facilitates control of the resulting capacitance when compared to manufacturing methods of the prior art.

BRIEF DESCRIPTION OF THE DRAWINGS

Various objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENT

The present invention provides several methods for forming embedded multilayer capacitors within a laminated circuit packaging structure. For convenience, the term printed circuit board (PCB) is used herein to describe any such laminated circuit packaging structure.

Several methods of forming embedded capacitors within a PCB are believed to be known to those of skill in the PCB design and manufacturing arts. These methods typically require laser ablation to form and/or trim the capacitor structures resulting in relatively time consuming and expensive manufacturing processes. The capacitor formation methods of the present invention eliminate the need for laser ablation and significantly reduce the manufacturing cost of the resulting PCBs.

Referring first to FIGS. 1a through 1f, there are shown schematic, cross-sectional views illustrating the steps in forming an embedded, multilayer capacitor in accordance with a first embodiment of the present invention.

Figure 1A:
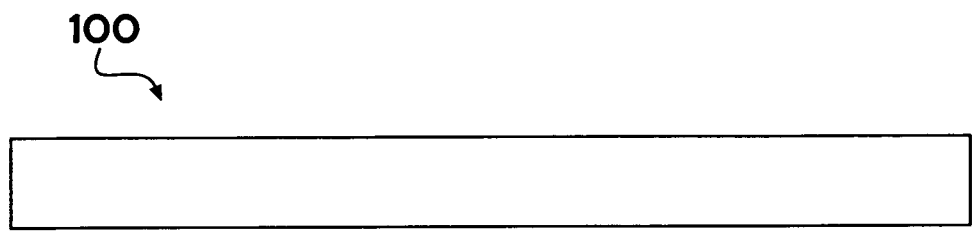
FIG. 1a is a side elevational view of a layer of photoimageable material.

FIG. 1a is a side elevational view of a layer of photoimageable material 100. As used herein, the term photoimageable material or photoimageable polymer is meant to be a material including three major components: a photo-active compound that undergoes cross-linking polymerization reaction on exposure to suitable radiation; a photo-packaging compound that initiates the radical polymerization; and a solvent or binder that carries both the photo-active and photo-packaging compounds either in liquid or solid form. One example of a photoimageable polymer is epoxy acrylate resin with a pendant —COOH group and 2,2' dimethoxy-2-phenylacetophenon. It will be recognized that other suitable photoimageable materials are known to those of skill in the art and such materials may be substituted for the material chosen for purposes of disclosure. Consequently, the invention is not considered limited to the specific photoimageable material chosen for purposes of disclosure.

Figure 1B:
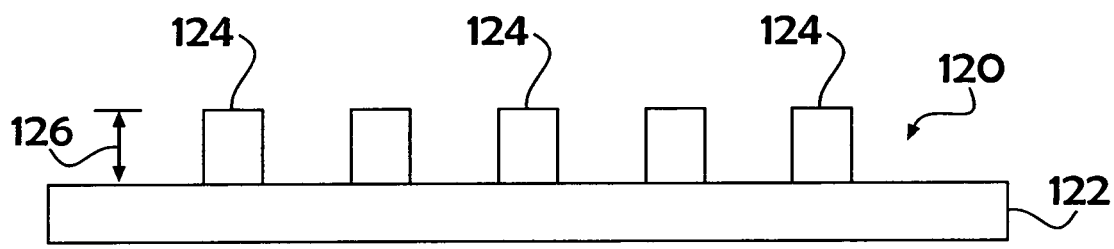
FIGS. 1b and 1c are a side elevational and a top plan view, respectively, of a dielectric substrate having a pattern of electrically conductive material.
Figure 1C:
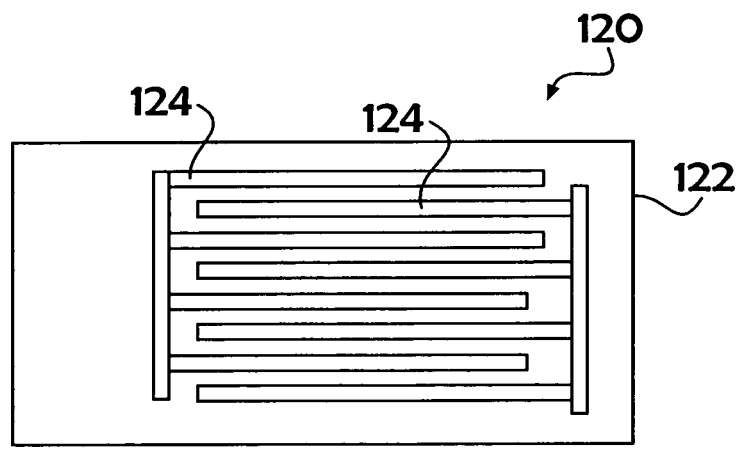

Referring now also to FIGS. 1b and 1c, there are shown a side elevational and a top plan view of a structure 120 having a dielectric substrate 122 having deposited thereupon a pattern of electrically conductive material 124, typically copper. Electrically conductive material 124 is typically disposed in a series of substantially parallel rows, best seen in FIG. 1c. Additional electrically conductive material 126 may be disposed perpendicular to the parallel rows to electrically connect alternate parallel traces of electrically conductive material 124. Ideally, the thickness of photoimageable material 100 and the height 126 of the electrically conductive material 124 are similar.

Figure 1D:
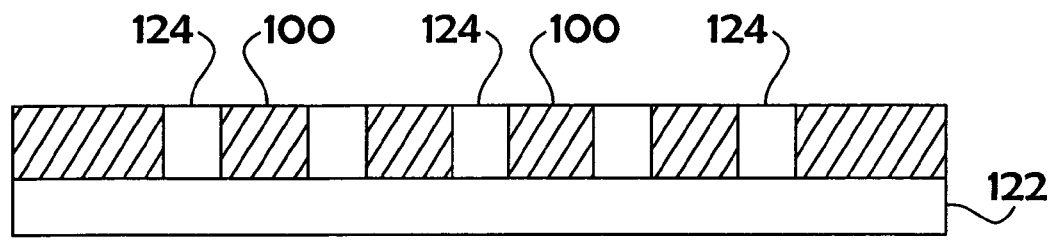
FIG. 1d is a side elevational, cross-sectional view of the substrate of FIGS. 1b and 1c having the photoimageable material of FIG. 1a laminated thereto.

First, photoimageable material 100 is laminated to structure 120, typically using a vacuum lamination process. It will be recognized that any other suitable lamination process may be used to laminate photoimageable material 100 to structure 120. FIG. 1d shows the result of the laminating step.

Figure 1E:
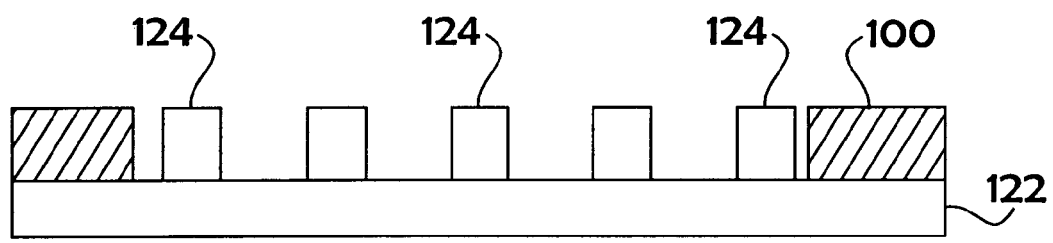
FIG. 1e is a side elevational, cross-sectional view of the laminated structure of FIG. 1d having portions of the photoimageable material removed.

After lamination, photoimageable material 100 is removed from the area occupied by electrically conductive material 124 leaving the electrically conductive material enclosed within remaining photoimageable material 100 as seen in FIG. 1e.

Alternatively, material 100 can be a drilled, free-standing, partially cured dielectric or pre-preg that has exactly the same opening as a photoimageable dielectric and can be laminated directly to structure 120 to produce the article shown in FIG. 1e. Drilled dielectric/pre-preg 100 can be completely cured or partially advanced during lamination. Drilled dielectric material does not require an expose and etching process as is required with a photoimageable dielectric.

Figure 1F:
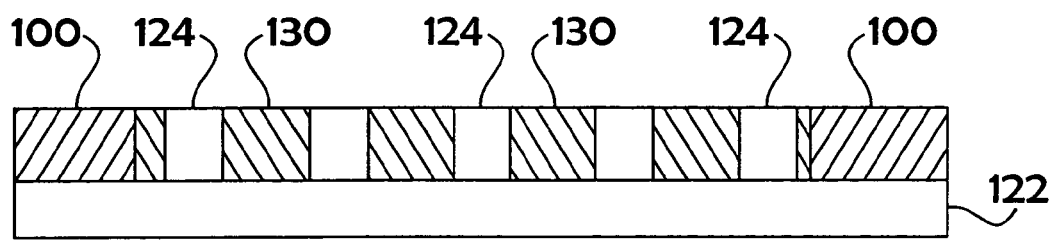
FIG. 1f is a side elevational, cross-sectional view of the structure of FIG. 1e having capacitor material dispensed between electrically conductive traces.

The next process step is dispensing capacitor material 130 into the spaces between electrically conductive traces 124 as shown in FIG. 1f. Capacitor material 130 typically comprises a polymer resin and a quantity of nano or micro powders or a mixture of nano, micro powders of ferroelectric ceramic material having average particle size substantially in the range of between about 0.005 microns and about 10 microns and a surface area for selected ones of said particles within the range of from about 0.5 to about 100 square meters per gram. Ferroelectric ceramic loading in the polymeric resin is in the range of 5 Vol % to 95 Vol %. It is also possible to use organic or polymer coated ferroelectric ceramic particles where organic/polymer coating helps to disperse particles in the solution. Furthermore, the capacitor material 130 can be a pure ferroelectric polymer such as polyvinylidene fluoride (PVDF) or it can be combination of ferroelectric polymer and ceramics.

By the term "ferroelectric ceramic" as used herein, is meant ceramics that possess ferroelectric properties. These include barium titanate, substituted barium titanate, strontium titanate, lead titanate, lead zirconate titanate, substituted lead zirconate titanate, lead magnesium niobate, lead zinc niobate, lead iron niobate, solid solutions of lead magnesium niobate and lead titanate, solid solutions of lead zinc niobate and lead titanate, lead iron tantalite, other ferroelectric tantalates, and combinations or mixtures thereof.

Capacitor material 130 is typically placed on substrate 122 between traces of electrically conductive material 124 by screen printing, ink jet deposition, stencil printing or dispensing. Capacitor material 130 can be liquid, paste or semi-solid. It is also possible to use resin coated copper capacitive type materials where capacitor material 130 flows on substrate 122 between traces of electrically conductive material 124 by a lamination process using a standard Cu mask. It will be recognized by those of skill in the art that other suitable methods for depositing of capacitor material 130 may be used; the invention is not limited to one of the particular methods disclosed for purposes of disclosure.

Following deposition of capacitor material 130, the resulting assembly is typically given a B-stage cure at a suitable temperature and for a suitable duration depending upon the specific capacitor material 130 used. For the preferred capacitor material 130, a temperature of approximately 130° and a duration of approximately 3 minutes has been found satisfactory. Finishing operations, including laminating and etching a copper layer are described in detail hereinbelow.

Figure 2A:
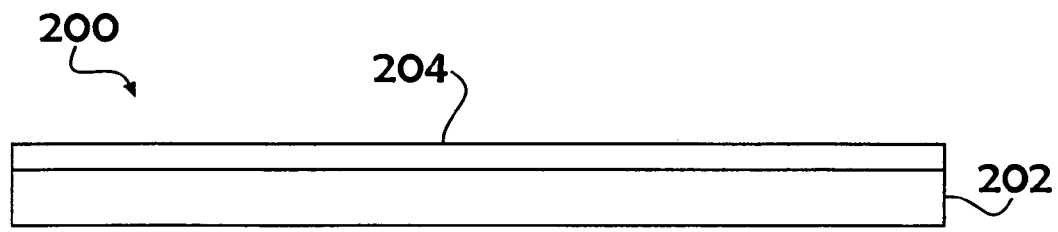
FIG. 2a is a side elevational, cross-sectional view of a copper-clad dielectric material.
Figure 2B:
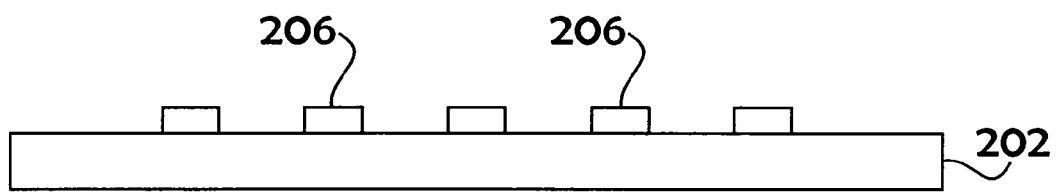
FIG. 2b is a side elevational, cross-sectional view of the copper-clad dielectric material of FIG. 1a with traces etched in the copper layer.

An alternate embodiment of the method of the invention is shown in FIGS. 2a through 2g. Referring first to FIG. 2a, a copper clad dielectric substrate 200 has a dielectric layer 202 and a copper layer 204. Copper layer 204 is first etched to provide a pattern (see FIG. 1c) of parallel, electrically conductive traces 206 as shown in FIG. 2b.

Figure 2C:
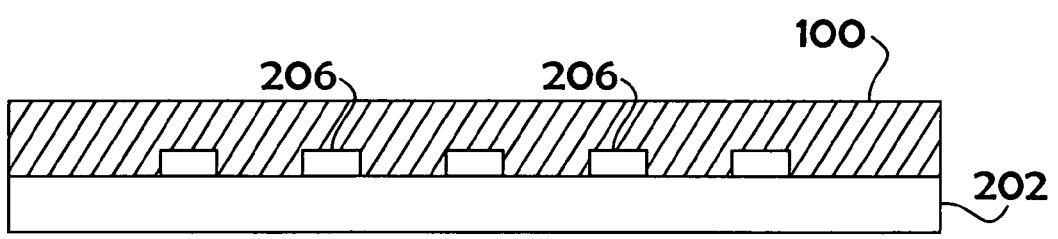
FIG. 2c is a side elevational, cross-sectional view of the of the structure of FIG. 2b with a photoimageable layer laminated thereto.

Next, a layer of photoimageable material 100 is laminated to the etched copper clad dielectric of FIG. 2b to form the structure shown in FIG. 2c.

Figure 2D:
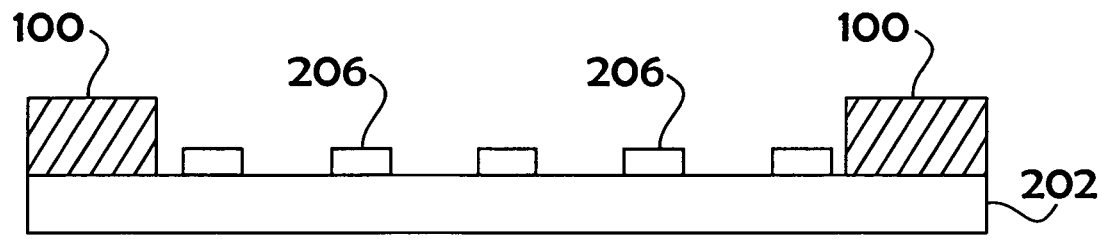
FIG. 2d is a side elevational, cross-sectional view of the laminated structure of FIG. 2c having portions of the photoimageable material removed.

Photoimageable dielectric material is exposed and etched to expose conductive traces 206 using processes well known to those of skill in the art to expose conductive traces 206. The resulting structure is shown in FIG. 2d.

Figure 2E:
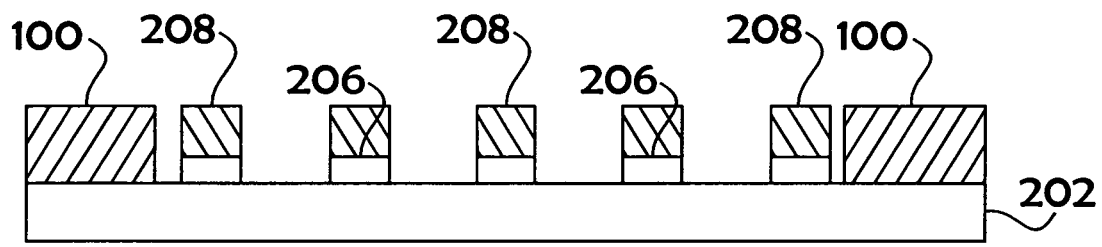
FIG. 2e is a side elevational, cross-sectional view of the structure of FIG. 2d having additional copper plated on the existing copper traces.

Next, copper 208 is grown on conductive traces 206 to raise conductive traces 206 to the height of photoimageable dielectric 100. The resulting structure is shown in FIG. 2e. Typically, an electroless or immersion copper deposition process is used. Such processes are believed to be well known to those of skill in the art and are not described in further detail herein. It will further be recognized that other copper deposition techniques known to those of skill in the art may be substituted.

Figure 2F:
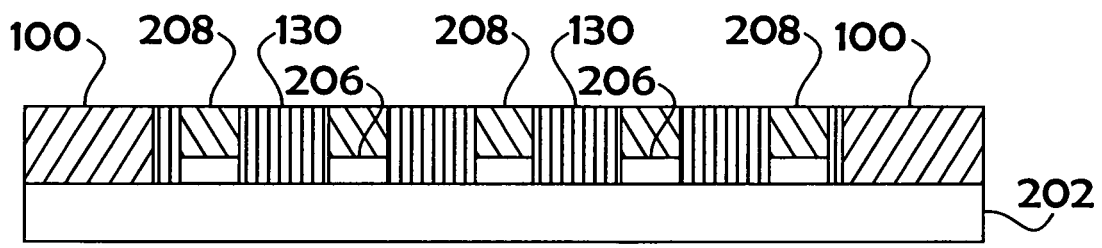
FIG. 2f is a side elevational, cross-sectional view of the structure of FIG. 2e having capacitor material dispensed between electrically conductive traces.
Figure 2G:
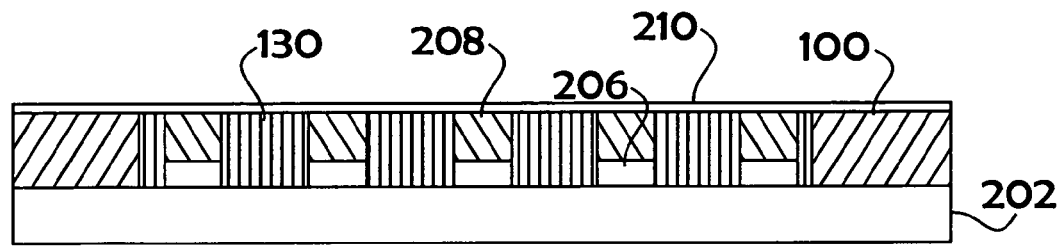
FIG. 2g is a side elevational, cross-sectional view of the structure of FIG. 2f with an additional copper layer laminated or deposited on the top thereof.

The next process step is dispensing capacitor material 130 into the spaces between electrically conductive traces 206/208 as shown in FIG. 2f. Capacitor material 130 typically comprises a polymer resin and a quantity of nano or micro powders or a mixture of nano, micro powders of ferroelectric ceramic material having average particle size substantially in the range of between about 0.005 microns and about 10 microns and a surface area for selected ones of said particles within the range of from about 0.5 to about 100 square meters per gram. Ferroelectric ceramic loading in the polymeric resin are in the range of 5 Vol % to 95 Vol %. It is also possible to use organic or polymer coated ferroelectric ceramic particles where organic/polymer coating helps to disperse particles in the solution. Furthermore, the capacitor material 130 can be a pure ferroelectric polymer such as PVDF or it can be a combination of ferroelectric polymer and ceramics.

Capacitor material 130 is typically placed on substrate 202 between traces 206/208 by screen printing, ink jet deposition, or stencil printing. It will be recognized by those of skill in the art that other suitable methods of capacitor material 130 deposition may be used and the invention is not limited to one of the particular methods disclosed for purposes of disclosure.

Following deposition of capacitor material 130, the resulting assembly is typically given a B-stage cure at a suitable temperature and for a suitable duration depending upon the specific capacitor material 130 used. For the preferred capacitor material 130, a temperature of approximately 130° and a duration of approximately 3 minutes has been found satisfactory.

Finishing operations for the method of FIGS. 1*a* through 1*f* and 2*a* through 2*f* include laminating a copper layer 210 over the top of the structure of FIG. 1*f* or 2*f*. A thin copper sheet, not shown, may be laminated or copper may be sputtered or otherwise deposited using any of the well-known techniques are described in detail hereinbelow.

After copper layer 210 is in place, copper layer 210 may be etched to provide a desired pattern of electrically conductive traces using any known etching technique.

A second alternate embodiment of the method of the invention for forming multilayer embedded capacitors is shown in FIGS. 3*a* through 3*d*.

Figure 3A:
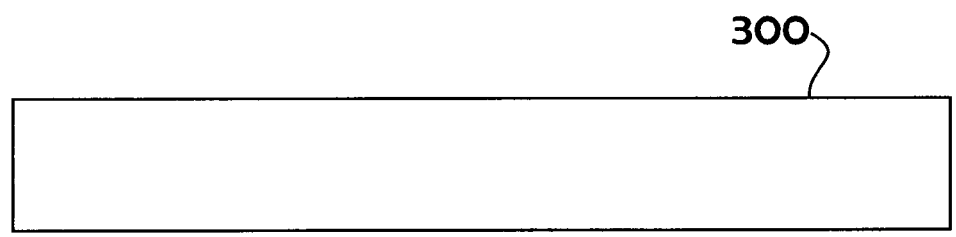
FIG. 3a is a side elevational, cross-sectional view of a thick, unclad dielectric material.

As shown in FIG. 3*a*, a relatively thick dielectric substrate 300 is provided. Typically, substrate 300 may be in the range of approximately 20-30 mils think. However, it will be recognized that other thicknesses may be utilized to meet a particular operating circumstance or environment.

Figure 3B:
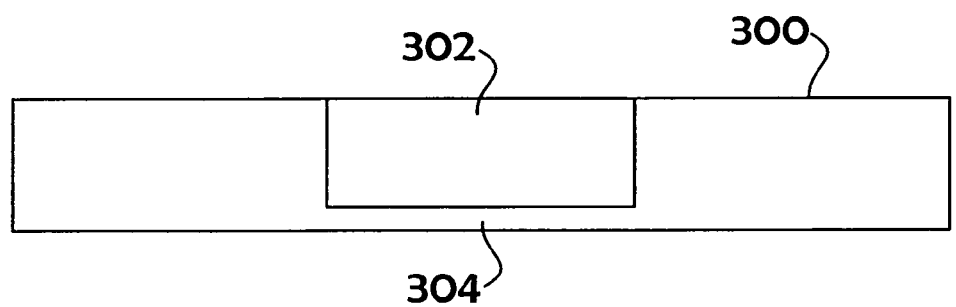
FIG. 3b is a side elevational, cross-sectional view of the dielectric material of FIG. 3a with an opening formed in the top surface thereof.

A wide groove 302 is formed in substrate 300 using a drill, milling machine, laser, or any other suitable instrument or tool. A thin portion 304 of substrate 300 is left to serve as a deposition surface as shown in FIG. 3*b*.

Figure 3C:
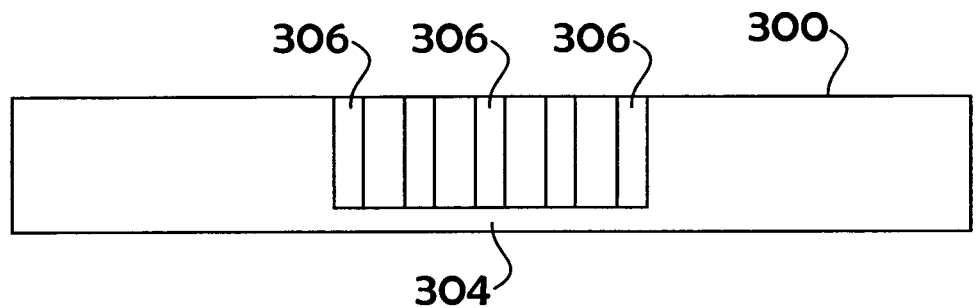
FIG. 3c is a side elevational, cross-sectional view of the dielectric material of FIG. 3b with full height copper traces formed within the opening.
Figure 3D:
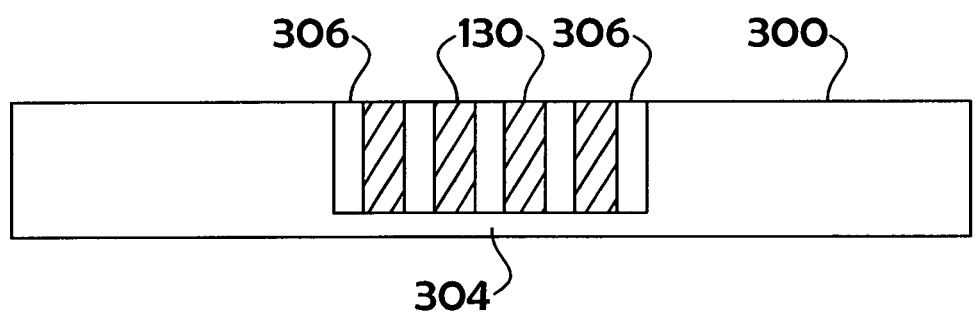
FIG. 3d is a side elevational, cross-sectional view of the structure of FIG. 3c with capacitor material placed between the copper traces.

As seen in FIG. 3*c*, a pattern of substantially parallel conductive traces 306 is next formed on thin substrate portion 304 using an ink jet or other suitable deposition process. Such deposition processes are well known to those of skill in the art and are not further described herein. Following deposition, the conductors are typically cured. In the embodiment chosen for purposes of disclosure, curing is accomplished at approximately 200° C. for approximately two hours.

Finally, capacitor material 130 is deposited in the spaces between conductors 306 using ink jet printing or any other suitable dispensing technique. Typical B-stage curing is performed at 130° C. for approximately 3-10 minutes. The B-stage curing is typically followed by further curing. In the embodiment chosen for purposes of disclosure, curing is accomplished at approximately 200° C. for a duration of approximately 2 hours. Although B-stage curing and a final curing process is preferred, the process is not limited to any particular curing process. This process can be a single step curing, or a B-stage lamination and curing, or a B-stage curing and lamination curing, etc.

It will be recognized that curing times and temperatures may be modified depending upon the choice of material, the printing or deposition techniques and the invention, therefore, is not considered limited to a particular material, time or temperature.

Another alternate embodiment of the method of the invention for forming multilayer embedded capacitors is shown in FIGS. 4*a*-4*e*.

Figure 4A:
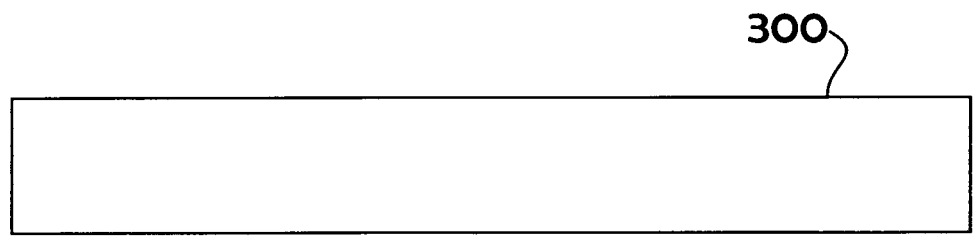
FIG. 4a is a side elevational, cross-sectional view of a thick, unclad dielectric material.

As shown in FIG. 4*a*, a relatively thick dielectric substrate 300 is provided. Typically, substrate 300 may be in the range of approximately 20-30 mils think. However, it will be recognized that other thicknesses may be utilized to meet a particular operating circumstance or environment.

Figure 4B:
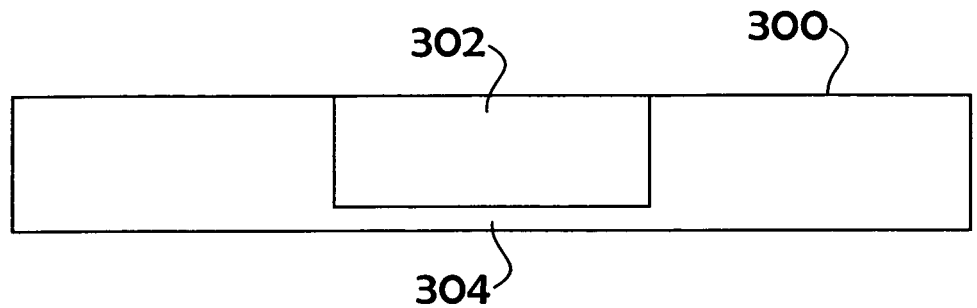
FIG. 4b is a side elevational, cross-sectional view of the dielectric material of FIG. 4a with an opening formed in the top surface thereof.

A wide groove 302 is formed in substrate 300 using a drill, milling machine, laser, or any other suitable instrument or tool. A thin portion 304 of substrate 300 is left to serve as a deposition surface as shown in FIG. 4*b*.

Figure 4C:
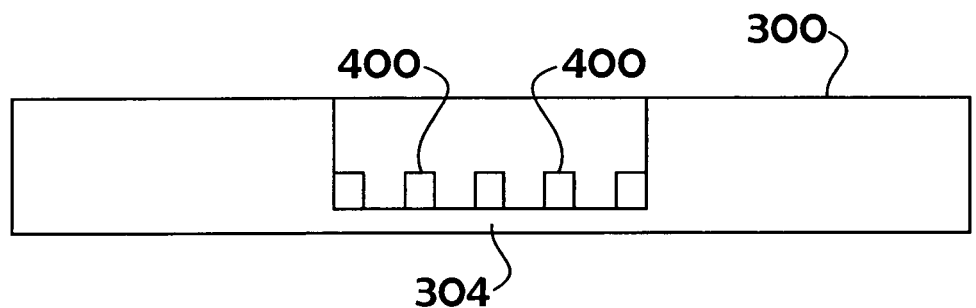
FIG. 4c is a side elevational, cross-sectional view of the dielectric material for FIG. 4b with thin copper traces formed within the opening.
Figure 4D:
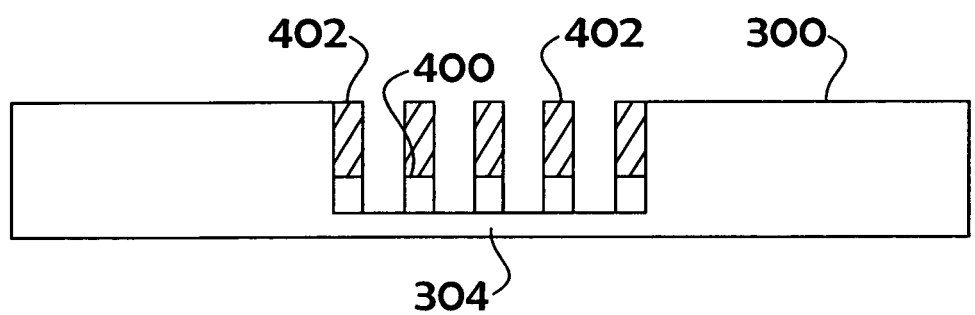
FIG. 4d is a side elevational, cross-sectional view of the structure of FIG. 4c with additional copper plated on the traces.
Figure 4E:
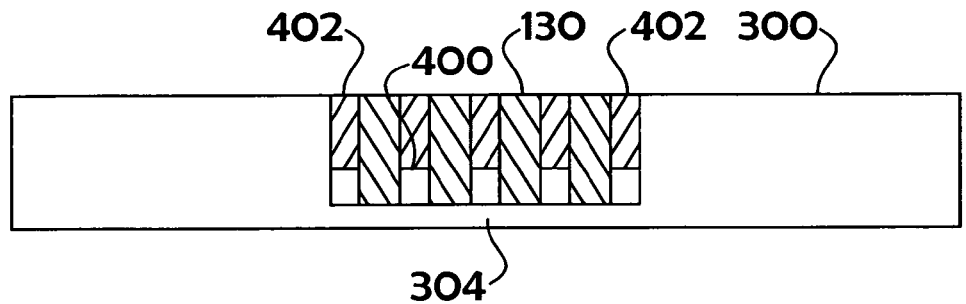
FIG. 4e is a side elevational, cross-sectional view of the structure of FIG. 4d with capacitor material placed between the copper traces.

As seen in FIG. 4*c*, a pattern of substantially parallel conductive traces 400 is next formed on thin substrate portion 304 using an ink jet or other suitable deposition process. Such deposition processes are well known to those of skill in the art and are not further described herein. It should be noted that unlike the embodiment of FIGS. 3*a*-3*d*, the thickness of traces 400 is significantly less than that of traces 306 (FIG. 3*c*). Following deposition, the conductors are typically cured. In the embodiment chosen for purposes of disclosure, curing is accomplished at approximately 200° C. for a duration of approximately 2 hours.

Next, electroless or immersion copper 402 is plated on traces 400 to bring the total height of the conductive trace 400, 402 to be substantially even with a top surface of dielectric 300.

Finally, capacitor material 130 is deposited in the spaces between conductors 400, 402 using ink jet printing or any other suitable dispensing technique. Typical B-stage curing is performed at 130° C. for approximately 3-10 minutes. The B-stage curing is typically followed by further curing. In the embodiment chosen for purposes of disclosure, curing is accomplished at approximately 200° C. for a duration of approximately 2 hours.

It will be recognized that curing times and temperatures may be modified depending upon the choice of material. The printing or deposition techniques and the invention is, therefore, not considered limited to a particular material, time or temperature.

Yet another alternate embodiment of the method of the invention for forming multilayer embedded capacitors is shown in FIGS. 5*a*-5*e*.

Figure 5A:
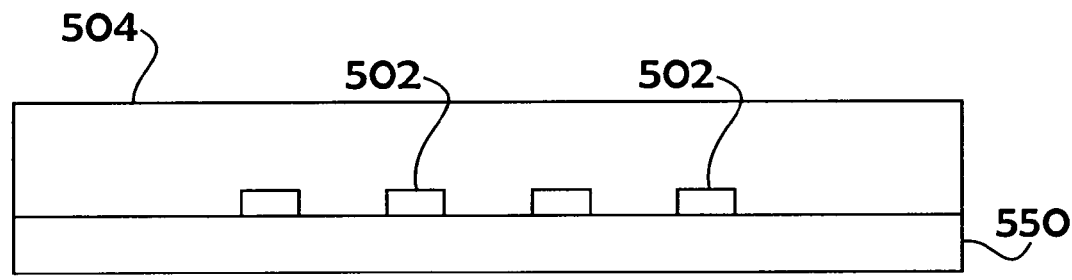
FIG. 5a is a side elevational, cross-sectional view of a copper-clad dielectric etched to form traces and having a photoimageable dielectric material laminated thereto.

As shown in FIG. 5*a*, an assembly comprising a thin dielectric substrate (typically FR4 or the like) has copper traces on an upper surface thereof. Copper traces 502 may be formed in any known conventional manner including, but not limited to, etching or deposition. A photoimageable dielectric 504 is bonded to the upper surface of dielectric 550 and copper traces 502.

Figure 5B:
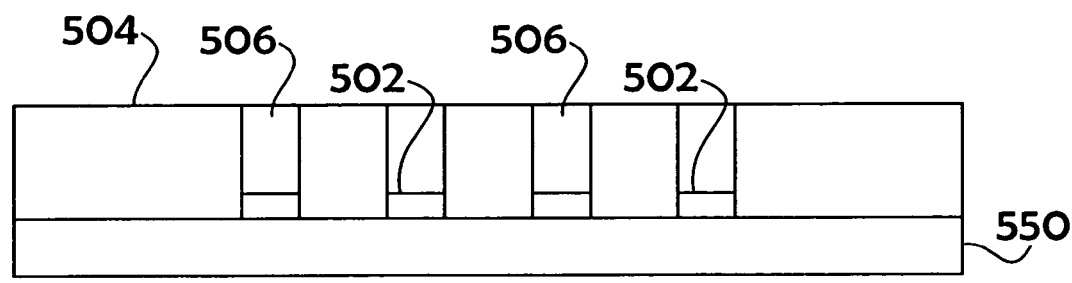
FIG. 5b is a side elevational, cross-sectional view of the structure of FIG. 5a after a first exposure and etch of the photoimageable dielectric material to expose the copper traces.

Photoimageable dielectric 504 is subjected to a first exposure and etching to reveal copper traces 502 through openings 506 in photoimageable dielectric 504 as seen in FIG. 5*b*.

Figure 5C:
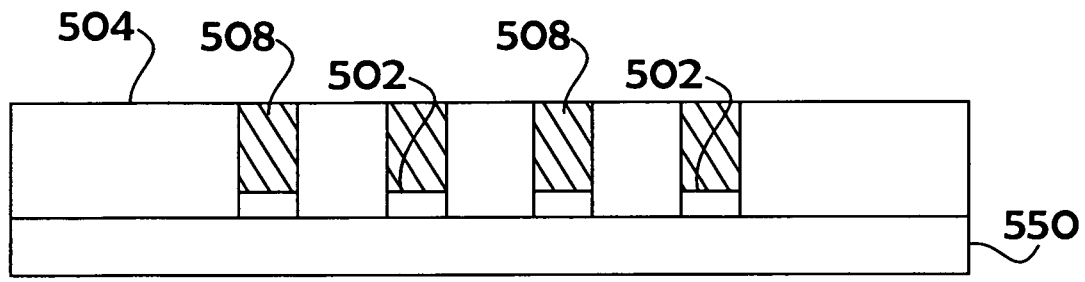
FIG. 5c is a side elevational, cross-sectional view of the structure of FIG. 5b with the original copper traces plated to form full height copper traces.

Next, copper 508 is plated on copper traces 502 through openings 506. Copper 508 is typically deposited using an electroless plating process. It will be recognized, however, that other suitable plating or depositions process may be utilized. The resulting structure is shown in FIG. 5*c*.

Figure 5D:
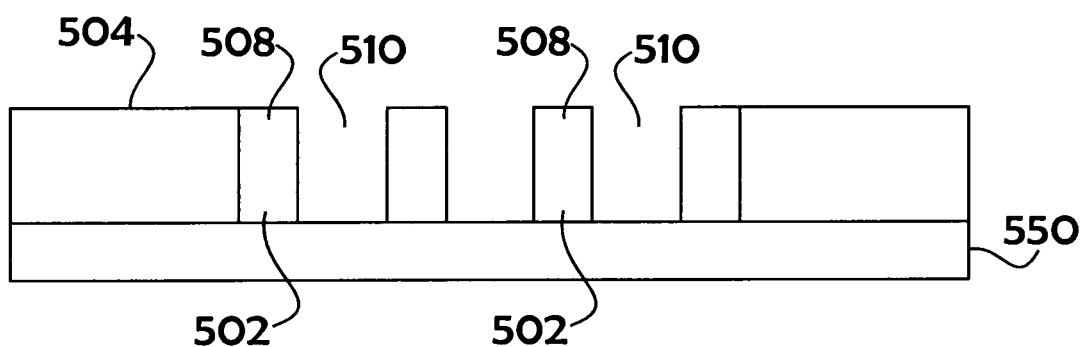
FIG. 5d is a side elevational, cross-sectional view of the structure of FIG. 5a after a second exposure and etch of the photoimageable dielectric material to expose the substrate between the copper traces.

Photoimageable dielectric 504 is next subjected to a second exposure and etching process to create openings 510 between copper traces 502, 508 as seen in FIG. 5*d*.

Figure 5E:
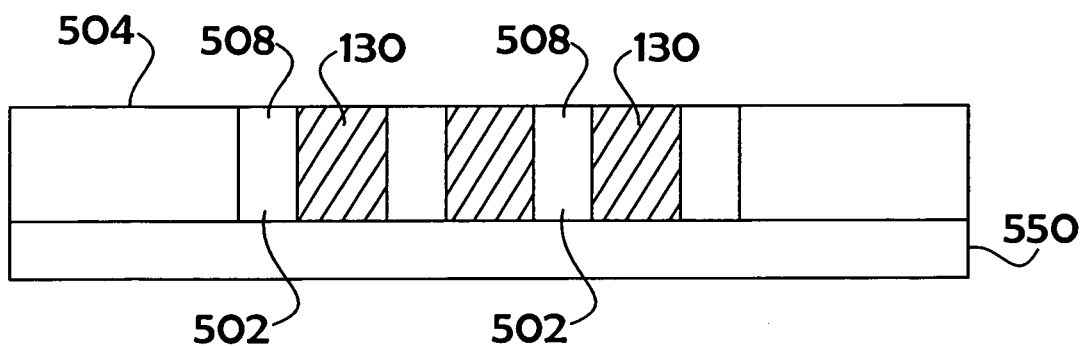
FIG. 5e is a side elevational, cross-sectional view of the structure of FIG. 5d with capacitor material placed between the copper traces.

Finally, capacitor material 130 is deposited in the spaces between conductors 502, 508 using ink jet printing or any other suitable dispensing technique. Typical B-stage curing is performed at 130° C. for approximately 3-10 minutes. The B-stage curing is typically followed by further curing. In the embodiment chosen for purposes of disclosure, curing is accomplished at approximately 200° C. for a duration of approximately 2 hours. The resulting structure is shown in FIG. 5e. Although all capacitance layers are shown perpendicular to the photoimageable dielectric surface 504, it is also possible to use any capacitance layer just above the photoimageable dielectric surface 504 with any angle ranging from 10 degrees to 170 degrees.

Figure 6:
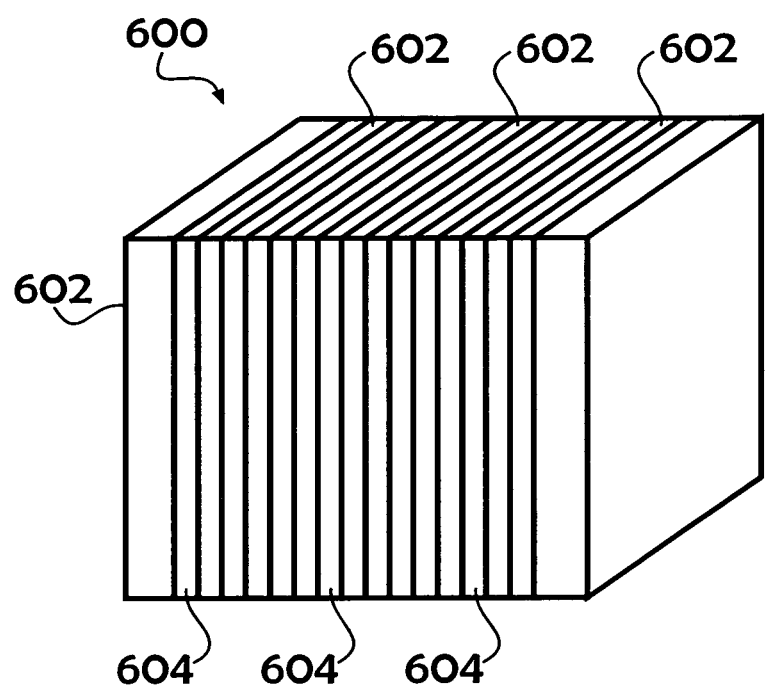
FIG. 6 is a schematic, vertical perspective view of an embedded capacitor formed in accordance with the method of the invention.

Referring now to FIG. 6, there is shown a schematic, vertical, cross-sectional, perspective view of an embedded multilayer capacitor formed using one of the foregoing methods of the present invention, generally at reference number 600. As may readily be seen, capacitor 600 consists of an alternating series of electrodes 602 (i.e., capacitor "plates"), and dielectric layers 604. Each pair of dielectric-separated plates 602 forms a section $C_x$ or layer of the multilayer capacitor 600. The total capacitance of $C_t$ capacitor 600 may be expressed as:

$$C_t = C_1 + C_2 + C_3 + \ldots + C_n$$

where: $C_t$ is the total capacitance of the multilayer capacitor; and $C_1, C_2, C_3, \ldots, C_n$ are the respective capacitance of individual capacitor sections or layers. Dielectric layers 604 have thickness ranges from about 0.1 micron to 100 microns.

Table 1 compares volumetric efficiency (i.e., the capacitance per unit volume). A dielectric constant of approximately 30 is assumed.

TABLE 1

Vertical Multilayer Embedded Capacitors

| Capacitance Layer Thickness | Normal Capacitance | 1 mil line, 1 mil space | 0.5 mil line, 0.5 mil space | 0.25 mil line, 0.25 mil space |
| --- | --- | --- | --- | --- |
| 1 mil  | 6.74 nF/inch³ | 3.37 nF/inch³  | 13.49 nF/inch³ | 53.98 nF/inch³  |
| 2 mils | 3.37 nF/inch³ | 6.74 nF/inch³  | 26.98 nF/inch³ | 107.96 nF/inch³ |
| 4 mils | 1.68 nF/inch³ | 13.48 nF/inch³ | 53.96 nF/inch³ | 215.92 nF/inch³ |

The values of Table 1 are calculated using the formula:

$$C = \epsilon \epsilon_0 A / d$$

Where:
C=capacitance in farads
$\epsilon$ =dielectric constant
$\epsilon_0 = 8.854 \times 10^{-12}$ F/m$^2$
A=area in m$^2$
d=coating thickness in meters The values of Table 1 show that vertical, multilayer capacitors in accordance with the methods of the present invention provide enhanced capacitance per unit volume compared to capacitors formed using methods of the prior art.

The following examples represent various combinations of capacitor dielectric materials and processes used to form capacitors according to various aspects of the invention. These should be understood to be examples only and do not limit the scope of this invention.

Example One

Fifty grams (gm) of cycloaliphatic epoxy resin (e.g., one sold under product designation "ERL-4211" by the Union Carbide Corporation, Danbury, Conn.) was mixed with about fifty gm of hexahydro-4-methylphthalic anhydride and 0.4 gm N, N dimethyl benzylamine. The mixed solution was stirred for ten minutes to assure uniform mixing. Sixty gm of barium titanate (BaTiO$_3$) powder was added to 17.5 gm of the mixed solution and formed into a screen printable paste. The average (mean) particle size for the added powder was about 0.5 micron, the surface area about 2.65 square meters/gm, and the specific gravity about 5.30.

Example Two

As in Example One, fifty gm of "ERL-4211" cycloaliphatic epoxy resin was mixed with about fifty gm of hexahydro-4-methylphthalic anhydride and 0.4 gm N, N dimethyl benzylamine. The mixed solution was stirred for ten minutes to assure uniform mixing. 150 gm of a combination of barium titanate, calcium titanate and zirconium powders was mixed thoroughly with 100 gm of the mixed solution and formed into a screen printable paste. The average (mean) particle size for the added powder was about 0.2 micron, the surface area about 8.25 square meters/gm, and the specific gravity about 5.15.

Example Three

As in Examples One and Two, above, fifty gm of "ERL-4211" cycloaliphatic epoxy resin was mixed with about fifty gm of hexahydro-4-methylphthalic anhydride and 0.4 gm N, N dimethyl benzylamine. The mixed solution was stirred for ten minutes to assure uniform mixing. 150 gm barium titanate powder was mixed thoroughly with 100 gm of the mixed solution and made into a screen printable paste. The average (mean) particle size for the added powder was about 0.1 micron, the surface area about 15.08 square meters/gm, and the specific gravity about 5.52.

Example Four 38.5 gm of an epoxy novolac resin sold under the product name "LZ 8213" from Huntsman, Salt Lake City, Utah, containing about 35 wt % methyl ethyl ketone and 6.5 gm of a phenoxy resin sold under the product name "PKHC" from Phenoxy Associates, Rock Hill, S.C., containing 50 wt % methyl ethyl ketone were mixed together with 100 gm of barium titanate (BaTiO$_3$) powder available from Cabot Corporation, Boyertown, Pa. ((50 gm BaTiO$_3$ with a mean particle size=0.065 micron, surface area=16 m$^2$/gm) and (50 gm BaTiO$_3$ with mean particle size=0.12 micron, surface area=8.2 m$^2$/gm)), thirteen gm propylene glycol methyl ether acetate) and twelve gm methyl ethyl ketone) and ball milled for three days until a homogeneous slurry was obtained. Here PKHC (organic) coating helped the barium titanate nano particles to disperse in solution.

This invention describes vertical multilayer capacitors. In general, horizontal multilayer capacitors can be prepared by laminating multiple capacitance layers which requires individual capacitance layer formation and subsequent lamination of next capacitance layer. Vertical multilayer capacitors can be generated from one horizontal dielectric layer. This does not require multiple laminations such as needed with multiple horizontal capacitance layers. Here, vertical multilayer capacitors can be generated within a specific volume of one dielectric layer.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. A method of forming a multilayer capacitor within a laminated circuit packaging structure, the method comprising:
   a) providing an assembly comprising a dielectric substrate having parallel traces of electrically conductive material formed on a major surface thereof and a layer of photoimageable dielectric laminated to said major surface, covering said major surface and said parallel traces of electrically conductive material;
   b) exposing and etching said photoimageable dielectric above said parallel traces of electrically conductive material to reveal said parallel traces of electrically conductive material through openings in said photoimageable dielectric defined by individual traces of electrically conductive material;
   c) plating copper onto said revealed parallel traces of electrically conductive material, filling said openings to a thickness that is coplanar with a top surface of a remaining portion of said layer of photoimageable dielectric;
   d) exposing and etching said photoimageable dielectric a second time between said copper-plated parallel traces of electrically conductive material to create openings defined by adjacent copper-plated parallel traces of electrically conductive material; and
   e) dispensing a capacitor-forming material into said openings defined by adjacent copper-plated parallel traces of electrically conductive material, filling said openings to form a vertically-oriented multilayer capacitor, the capacitance thereof being proportional to the thickness of said photoimageable dielectric.

2. The method of forming a multilayer capacitor within a laminated circuit packaging structure as recited in claim 1, the method further comprising:
   f) curing said capacitor-forming material after step e).

3. The method of forming a multilayer capacitor within a laminated circuit packaging structure as recited in claim 1, the method further comprising:
   f) laminating a planar copper sheet over the resulting capacitor of step e), such that the planar copper sheet is in electrical contact with said copper-plated parallel traces of electrically conductive material; or depositing a copper layer over the resulting capacitor of step e), such that the copper layer is in electrical contact with said copper-plated parallel traces of electrically conductive material.

4. The method of forming a multilayer capacitor within a laminated circuit packaging structure as recited in claim 3, the method further comprising:
   g) after step f), etching said planar copper sheet or said copper layer to provide a pattern of electrically conductive traces.

* * * * *